United States Patent [19]

Maples

[11] Patent Number: 4,471,244
[45] Date of Patent: Sep. 11, 1984

[54] SENSE AMPLIFIER
[75] Inventor: Kenneth R. Maples, Sunnyvale, Calif.
[73] Assignee: Data General Corporation, Westboro, Mass.
[21] Appl. No.: 286,391
[22] Filed: Jul. 22, 1981
[51] Int. Cl.³ .................. H03K 5/153; H03K 5/24
[52] U.S. Cl. .................................. 307/530; 307/356; 307/360
[58] Field of Search ............. 307/355, 356, 360, 530, 307/358; 328/146, 147

[56] References Cited
U.S. PATENT DOCUMENTS 3,789,312  1/1974  Heller et al. ...................... 307/530
3,876,887  4/1975  Reed .................................. 307/530
3,991,379 11/1976  Chadwick et al. ................ 307/358
4,358,690 11/1982  Ollendick .......................... 307/530

Primary Examiner—John Zazworsky
Attorney, Agent, or Firm—Robert L. Dulaney

[57] ABSTRACT

An MOS sense amplifier having a differential amplifier circuit, a hysteresis circuit and a precharging circuit. The differential amplifier circuit has a plurality of amplifier stages and a level shifter to yield digital level outputs. The hysteresis circuit responsive to an input signal, provides one of two reference voltages to the differential amplifier. The precharge circuit charges the system capacitances and provides a bias voltage to the differential amplifier to enable amplification of small signals.

8 Claims, 2 Drawing Figures

SENSE AMPLIFIER

The present application is related to copending U.S. application Ser. No. 286,392. Both applications were filed July 22, 1981 and are assigned to Data General Corporation.

BACKGROUND OF THE INVENTION

1. Field of the Invention

The present invention relates generally to sense amplifiers and particularly to an MOS (metal oxide semiconductor) sense amplifier having unique precharging and reference voltage circuitry.

2. Description of the Prior Art

Sense amplifiers are commonly used where there is a need to sense a relatively small voltage difference between two voltage sources and amplify it to the level required by the system. A typical sense amp will contain one or more coupled, differential amplifier stages. The first stage having a transistor connected to a reference voltage and a transistor connected to the voltage to be compared. These two transistors are commonly termed the differential pair. Hysteresis, or variation in the reference voltage, is commonly controlled in the prior art by varying the voltage applied to a biasing transistor connected to the sources of the differential pair.

This method of achieving the hysteresis effect has certain limitations in that it is difficult to vary the reference voltage by only a few millivolts. In addition, due to processing variations in the manufacturing of metal oxide semiconductor circuitry, the variations in the hysteresis points may be significant. Also, the calculations related to defining a new hysteresis point are generally cumbersome and lengthy.

Another problem in the prior art is the amount of voltage required to reach the threshold of the comparison transistor. In a standard MOS differential amplifier this limitation generally means that signals below one and a half volts cannot be amplified.

Related to the sensing of key positions in keyboards used with video display terminals, two prior art techniques are known. One involves using make-or-break contacts for each key position. This method has several problems, such as susceptibility to contamination due to dust, moisture or other environmental factors and, over a period of time, degradation or contamination of the contacts due to electrical arcing at control closure. Also, a closed contact, undesirably, draws a large amount of power. The other method of key sensing involves using a sense amplifier constructed of discrete components. This method is also undesirable because of the labor costs involved in manufacture, the amount of power consumed in operation, and the space occupied by the circuitry. In addition, a discrete sense amp may drift out of specification over time.

The present invention relates to a novel sense amp circuit for resolving the above prior art problems.

SUMMARY OF THE INVENTION

The present invention relates to a novel sense amplifier having differential amplifier structure and apparatus for generating a variable reference voltage. The present invention also relates to a novel sense amplifier having structure for charging the capacitances of the sense amplifier and the related circuits such that a bias voltage is supplied to the differential amplifier.

It is another feature of the invention that the reference voltage may be varied in accordance with an input signal.

It is yet another feature of the invention that the sense amplifier is constructed as an MOS integrated circuit.

It is an advantage of the present invention that the variable reference voltage is dependent only on a ratio of resistors without regard to absolute resistor values.

It is another advantage of the invention that the differential amplifier can amplify signals smaller than the threshold of the differential pair transistors.

Other features and advantages of the present invention will be understood by those of ordinary skill in the art after referring to the detailed description of the preferred embodiment and drawings herein.

DESCRIPTION OF THE PREFERRED EMBODIMENT

Figure 1:
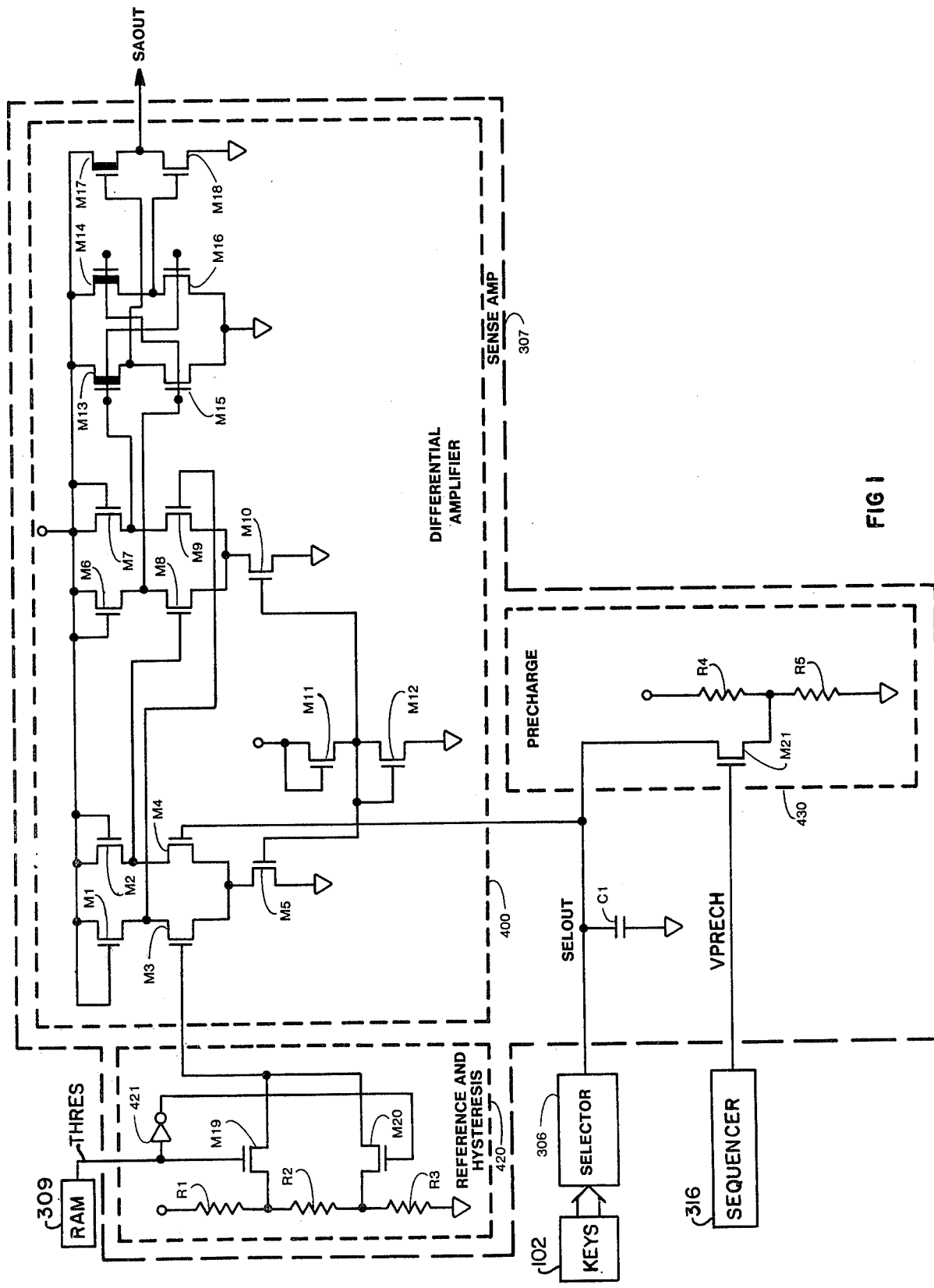
FIG. 1 is a schematic diagram of Sense Amp 307.

Referring to FIG. 1, SELOUT is a voltage signal supplied to Sense Amp 307. In a capacitive keyboard application, for example, selector 306 would be connected to the sense lines from each of the keyboard keys 102. Selector 306 would sequentially select individual keys to be the source of output voltage SELOUT. Therefore, SELOUT would be the voltage returned from an individual key to which an excitation voltage has been applied. As discussed below, in this type of application, the level of SELOUT will vary in accordance with the position (up or down) of the key being sensed.

Sense Amp 307 compares SELOUT with a reference voltage to determine the current position of the key. To reduce the possibility of false position indications resulting from keys in interim positions (i.e. less than full up or full down), the reference voltage level used by Sense Amp 307 is based on the prior position of the key (THRES) from RAM 309. RAM 309 retains information descriptive of the previous position of each of the keys and sequentially provides this information to reference and hysteresis logic 420 for the key currently selected by selector 306. In this embodiment, therefore, SELOUT is indicative of the present position of the selected key and THRES is indicative of the prior position of the selected key VPRECH, from sequencer 316, precharges elements in Sense Amp 307, as discussed in more detail below.

Looking now at FIG. 1, a schematic diagram of Sense Amp 307 is shown. Differential Amplifier Logic 400 is constructed of enhancement mode MOSFET transistors M1–M12, M15, M16 and M18 and depletion mode MOSFET transistors M13, M14 and M17. Within Differential Amplifier Logic 400, M1–M5 are connected as a first differential amplifier stage, M6–M10 are connected as a directly coupled second differential amplifier stage, M11 and M12 are connected as a biasing circuit to hold the gates of M5 and M10 at a constant voltage. M13–M16 are connected as a third amplifier stage, and M17 and M18 are connected as a level shifter to adjust the output of Differential Amplifier Logic 400 to the proper level.

Within Differential Amplifier Logic 400, the drains of M1, M2, M6, M7, M11, M13, M14 and M17 and the gates of M1, M2, M6, M7 and M11 are connected to a constant voltage. The source of M1 is connected to the drain of M3 and the gate of M9. The source of M2 is connected to the drain of M4 and the gate of M8. The sources of M3 and M4 are connected to the drain of M5. The source of M11 is connected to the gates of M5 and M10 and the drain and gate of M12. The source of M6 is connected to the drain of M8 and the gates of M15 and M14. The source of M7 is connected to the drain of M9 and the gates of M13 and M16. The sources of M8 and M9 are connected to the drain of M10. The source of M13 is connected to the drain of M15 and the gate of M17. The source of M14 is connected to the drain of M16 and the gate of M18. The sources of M5, M10, M12, M15, M16 and M18 are connected to ground. The source of M17 is connected to the drain of M18 and to output signal SAOUT. The gate of M3 is connected to Reference and Hysteresis Logic 420 and the gate of M4 is connected to Precharge Logic 430 selector 306 and, in effect, to capacitance C1, which represents the parasitic capacitances inherently associated with the integrated circuitry and printed circuit board.

Reference and Hysteresis Logic 420 is constructed of resistors R1, R2 and R3, enhancement mode MOSFET transistors M19 and M20, and inverter 421. The gate of M19 is connected to THRES and the input of inverter 421. The gate of M20 is connected to the output of inverter 421 (i.e., the inverse of THRES). R1 is connected at one end to a constant voltage source and at the other end to one end of R2 and the drain of M19. R3 is connected at one end to ground and at the other end to the other end of R2 and the drain of M20. The sources of M19 and M20 are connected to the gate of M3.

Precharge Logic 430 is constructed of enhancement mode MOSFET transistor M21 and resistors R4 and R5. The drain of M21 is connected to the gate of M4, Selector 306 and Capacitance C1. The source of M21 is connected to one end of R4 and R5. The other end of R4 is connected to a constant voltage and the other end of R5 is connected to ground. Finally, the gate of M21 is connected to precharge signal VPRECH.

Each key, as mentioned, operates as a variable capacitor, in that the key capacitance varies with key depression. Since the key capacitance affects the voltage seen by Sense Amp 307 from the selected sense line, comparison of the returned voltage with the voltage corresponding to the state of the key from the prior scan allows key position to be detected.

When VPRECH is asserted by sequencer 316, M21 is turned on and the divided voltage from R4 and R5 is allowed to pass to C1 and to the key. After a length of time, dependent on element values, C1 and the key will have been charged to the level of the voltage passed by M21 from R4 and R5. This bias voltage will remain at the gate of M4, if VPRECH is removed, until leakage or an external stimulus changes it. By appropriate selection of the ratio of R4 and R5, the bias voltage can be made to exceed the threshold of M4. This will allow M4 to amplify comparison voltages much smaller than its threshold, which is typically about 1.5 V.

It is highly desirable to avoid false determinations of keystrokes due to key "teasing" (i.e., partial depression of a key). Most of the effects of teasing can be eliminated by varying the reference voltage against which the voltage from the sense line is compared. For purposes of illustration, assume the state voltage returned if a key is completely up is approximately 75 mv while a fully depressed key will return a state voltage of 300 mv. These numbers are for discussion only and are chosen only to illustrate a sample embodiment of the invention. If the key had been up at the last scan of the keyboard, the reference voltage could be set at, for example, 225 mv (plus the bias voltage to M4) to ensure the key is almost fully depressed before a position change is flagged. Similarly, if the previous key position was down, the reference could be set at 150 mv (plus the bias voltage to M4) to ensure the key is almost fully up before a position change is flagged.

For each key being sampled, the THRES signal, representing the last detected state of the key, is supplied to the gate of M19. The inverse of THRES is supplied to the gate of M20. Either M19 or M20 will therefore be allowed to pass a voltage to gate of M3. This voltage will be the reference against which the voltage from the key will be compared. By appropriate adjustment of the ratios of the values of R1, R2 and R3, the magnitude of the reference voltage will be either the "key-up" reference voltage or the "key-down" reference voltage, depending on the prior key state.

Figure 2:
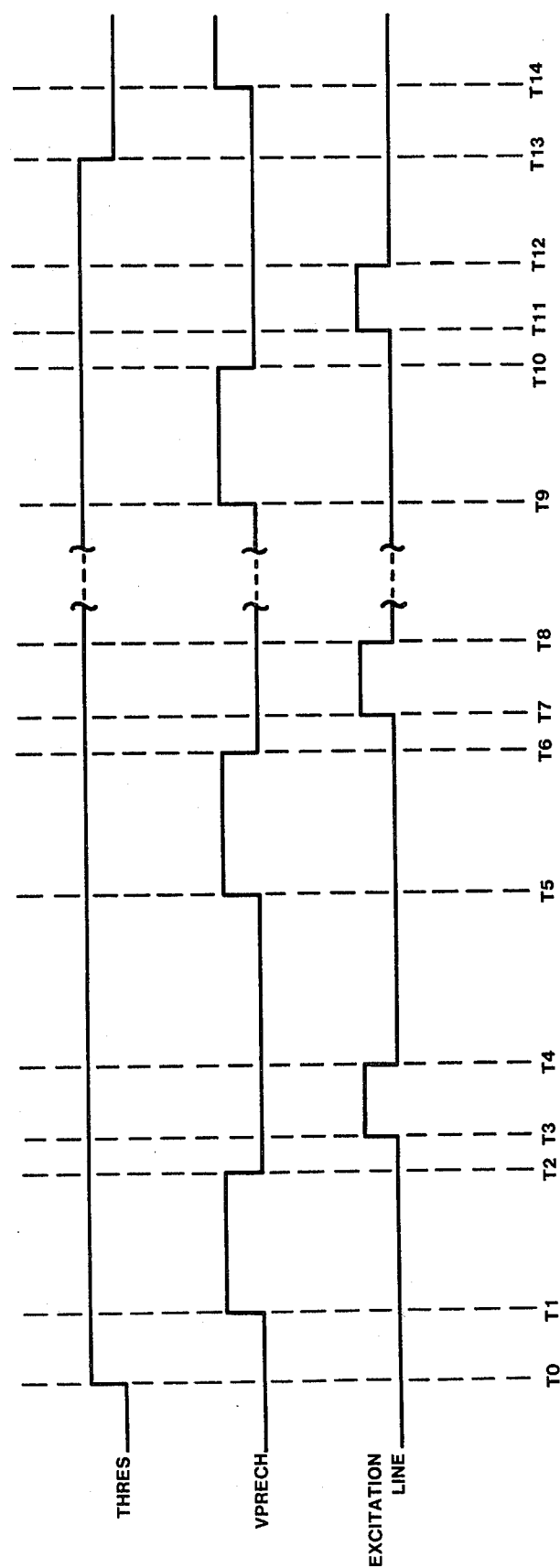
FIG. 2 is a timing diagram illustrating the operation of Sense Amp 307.

Referring now also to FIG. 2, the operation of Sense Amp 307 will be discussed. The signal labeled "Excitation Line" in FIG. 2 represents the voltage applied to the appropriate excitation line connected to the key to be sampled. At T0, the THRES signal for the next key to be sampled is supplied to Sense Amp 307. This signal, or its inverse, will turn on either M19 or M20 to provide the appropriate reference voltage to M3. In this example, THRES goes high at T0, turning M19 on and M20 off. At T1, VPRECH is imposed on M21 and also on the excitation line and sense line, to ensure all capacitances are precharged. From T1 to T2, C1 and the key are charged to the divided voltage from R4 and R5 and M4 is turned on. At T2, VPRECH is removed. C1 and the key substantially retain their voltage levels. At T3, a voltage is applied to the appropriate excitation line. This step voltage is divided by the ratio of the capacitance of the key being sampled to C1. Since the capacitance of the key is variable, the ratio will be a function of key position. The state voltage resulting from the sense line is added to the bias voltage left by the precharging process at the gate of M4. Differential Amplifier Logic 400 will compare the reference voltage with the comparison voltage and produce output SAOUT. If the comparison voltage exceeds the reference voltage (i.e., key is down) SAOUT will be substantially 0V. If the comparison voltage is less than the reference voltage (i.e., key is up), SAOUT will be substantially +5 V.

At T4, after a sufficient time period to allow SAOUT to be sampled, the voltage is removed from the excitation line. As stated earlier, each key is sampled 6 times. Therefore, at T5, VPRECH is asserted again until T6. At T7, the voltage is applied to the excitation line and SAOUT is again output from Differential Amplifier 400. At T8, the voltage is removed from the excitation line. This precharge and excitation line sequence will continue until SAOUT has been supplied 6 times. At T12, the excitation line goes low for the sixth time. At T13, sampling of the key is complete and the THRES value for the next key is supplied to Reference and Hysteresis 420.

With the present invention, variations in reference voltage may be controlled within a few millivolts. If the reference voltage must be changed, a new hysteresis point can be achieved simply by varying the ratios of the Reference and Hysteresis 420 resistors. Also, since the reference voltage is dependent only upon the ratio of resistor values, and not their absolute values, the effects of processing variations are substantially eliminated. In addition, precharging C1 and the key to a level above the threshold of M4 allows the circuit to amplify state voltages on the order of 20 millivolts.

The invention may be embodied in yet other specific forms without departing from the spirit or essential characteristics thereof. For example, while the present embodiment uses Sense Amp 307 with a capacitance keyboard, it can be adapted for any small signal amplification need by the appropriate choice of C1 and the external capacitance. In addition, Differential Amplifier Logic 400 could be modified in various ways using well known differential amplifier techniques to achieve the type of output signal required.

The present embodiments are therefore to be considered in all respects as illustrative and not restrictive. The scope of the invention is indicated by the appended claims rather then by the foregoing description, and all changes which come within the meaning can range of equivalency are therefore intended to be embraced therein.

I claim:

1. Sense amplifier apparatus for use with means for generating a digital reference voltage input signal having two possible operating logic states and means for generating a comparison voltage, said apparatus comprising:

means, connected to said input signal generating means, for generating first and second reference voltages and for selecting one of said reference voltages such that said first reference voltage is selected when said input signal is in a first logic state and said second reference voltage is selected when said input signal is in a second logic state; and differential amplifier means, including means for receiving the selected ones of said reference voltages and said comparison voltage, for comparing said comparison voltage and said selected one of said reference voltages and generating an output related to the results of said comparison.

2. The apparatus of claim 1 wherein said means for generating and selecting comprises:

first, second and third resistors connected in series between a constant voltage and ground;

a first reference voltage transistor connected to said differential amplifier means, said input signal, and the junction of said first and said second resistors such that said first reference voltage transistor supplies said first voltage to said differential amplifier means only if said digital reference voltage input signal has a first logic state; and a second reference voltage transistor connected to said differential amplifier means, the inverse of said input signal, and the junction of said second and said third resistors such that said second reference voltage transistor supplies said second voltage to said differential amplifier means only if said input signal has a second logic state.

3. The apparatus of claim 1, wherein said differential amplifier means contains at least one differential transistor pair, said pair being connected such that said selected reference voltage is supplied to the gate of a first transistor of the differential transistor pair and said comparison voltage is supplied to the gate of the second transistor of the differential transistor pair.

4. The apparatus of claim 3, wherein said apparatus is constructed as an integrated circuit having parasitic capacitances and wherein said comparison voltage includes a bias voltage component, said apparatus further comprising:

means for precharging said parasitic capacitances of said apparatus to provide said bias voltage component, said bias voltage exceeding the threshold gate voltage of said second transistor, whereby said apparatus can amplify state voltages smaller than the threshold gate voltage of said second transistor.

5. Sense amplifier apparatus for use with means for generating a bias voltage, means for generating a state voltage and means for generating a reference voltage said apparatus comprising:

means, connected to said bias voltage means and said state voltages means for generating a comparison voltage having a bias voltage component and a state voltage component; and differential amplifier means, connected to said comparison voltage generating means and said reference voltage generating means, for comparing said comparison voltage and said reference voltage and generating an output corresponding thereto, said differential amplifier having at least one differential transistor pair connected such that said reference voltage is supplied to the gate of a first transistor of the differential transistor pair and said comparison voltage is supplied to the gate of a second transistor of the differential transistor pair; said bias voltage component exceeding the threshold gate voltage of said second transistor, whereby said apparatus can amplify state voltages smaller than the gate threshold of said second transistor.

6. The apparatus of claims 1 or 5, wherein said apparatus is constructed as an MOS integrated circuit.

7. In a sense amplifier apparatus for use with means for generating an input voltage signal, means for generating and retaining a state voltage and means for generating a precharge voltage, said apparatus having means connected to said input voltage signal generating means for generating a reference voltage, means connected to said precharge voltage means for generating and retaining a bias voltage and differential amplifier means connected to said bias voltage means, said reference voltage generating means and said state voltage generating means, a method for deriving a differential amplifier output signal based on said input signal and said state voltage, said method comprising the steps of:

(a) supplying said input signal to said reference voltage generation means, to obtain the reference voltage to said differential amplifier means;

(b) applying said precharge voltage to said bias voltage means and to said means for generating a state voltage to obtain a bias voltage and a state voltage at said differential amplifier;

(c) removing said precharge voltage from said bias voltage means and said state voltage means;

(d) supplying said state voltage to said differential amplifier such that said state voltage is added to said bias voltage; and (e) comparing said state and bias voltage with said reference voltage and generating an output related to the results of said comparison.

8. In a sense amplifier apparatus for use with means for generating an input voltage signal, means for generating a precharge voltage and means for generating a comparison voltage, said apparatus having means connected to said input voltage signal generating means for generating a reference voltage and differential amplifier means connected to said reference voltage generating means and to said comparison voltage generating means, said differential amplifier means containing at least one differential amplifier stage, said stage being constructed of a plurality of transistors, having a differential transistor pair and being connected such that said reference voltage is supplied to the gate of a first transistor of the differential pair of said stage and said comparison voltage is supplied to the gate of the second transistor of the differential transistor pair of said stage, a method for deriving a differential amplifier output signal based on said input signal and said comparison voltage, said method comprising the steps of:

(a) supplying said input signal to said reference voltage generation means, to obtain the reference voltage to said gate of said first transistor;
(b) applying said precharge voltage to said apparatus and to said means for generating a comparison voltage to obtain a bias voltage and a comparison voltage;
(c) removing said precharge voltage from said apparatus and said comparison voltage means;
(d) supplying said comparison voltage to said gate of said second transistor such that said comparison voltage is added to said bias voltage; and
(e) comparing said state and bias voltage with said reference voltage and generating an output related to the results of said comparison.

* * * * *